United States Patent
DeBoer et al.

(10) Patent No.: US 6,627,508 B1
(45) Date of Patent: Sep. 30, 2003

(54) METHOD OF FORMING CAPACITORS CONTAINING TANTALUM

(75) Inventors: Scott Jeffrey DeBoer, Boise, ID (US); F. Daniel Gealy, Kuna, ID (US); Randhir P. S. Thakur, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/684,069

(22) Filed: Oct. 6, 2000

Related U.S. Application Data

(60) Continuation of application No. 09/098,035, filed on Jun. 15, 1998, now Pat. No. 6,146,959, which is a division of application No. 08/916,771, filed on Aug. 20, 1997, now Pat. No. 5,910,880.

(51) Int. Cl.[7] .............................................. H01G 4/002
(52) U.S. Cl. ...................................... 438/381; 438/239
(58) Field of Search ................................ 257/296–313, 257/532–535; 438/239–256, 386–399

(56) References Cited

U.S. PATENT DOCUMENTS

| | | |
|---|---|---|
| 3,210,607 A | 10/1965 | Flanagan |
| 3,886,415 A | 5/1975 | Genthe |
| 4,333,808 A | 6/1982 | Bhattacharyya et al. |
| 4,437,139 A | 3/1984 | Howard |
| 4,464,701 A | 8/1984 | Roberts et al. |
| 4,873,610 A | 10/1989 | Shimizu et al. |

(List continued on next page.)

FOREIGN PATENT DOCUMENTS

| | | |
|---|---|---|
| JP | 1-222469 A | 5/1989 |
| JP | 403209869 A | 9/1991 |
| JP | 05-221644 | 8/1993 |

(List continued on next page.)

OTHER PUBLICATIONS

Richard C. Jaeger, vol. V: Introduction to Microelectronic Fabrication, Addison Wesley Publishing Company, Reading Massachusetts, 1988, pp. 116.*

(List continued on next page.)

*Primary Examiner*—Wael Fahmy
*Assistant Examiner*—Marcus D. Pizarro-Crespo
(74) *Attorney, Agent, or Firm*—Wells St. John P.S.

(57) ABSTRACT

The invention pertains to semiconductor circuit components and capacitors, and to methods of forming capacitors and semiconductor circuit components. In one aspect, the invention includes a method of forming a dielectric layer comprising: a) forming a first tantalum-comprising layer; and b) forming a second tantalum-comprising layer over the first tantalum-comprising layer, the second tantalum-comprising layer comprising nitrogen. In another aspect, the invention includes a method of forming a capacitor comprising: a) forming a first capacitor plate; b) forming a first layer over the first capacitor plate, the first layer comprising tantalum and oxygen; c) annealing the first layer in the presence of an ambient comprising a nitrogen-comprising gas containing at least one compound selected from a group consisting of ammonia, hydrazine and hydrazoic acid; the annealing forming a second layer over the first layer; and d) forming a second capacitor plate over the second layer. In another aspect, the invention includes a capacitor comprising: a) a first capacitor plate; b) a first tantalum-comprising layer over the first capacitor plate; c) a second tantalum-comprising layer over the first tantalum-comprising layer, the second tantalum-comprising layer comprising nitrogen; and d) a second capacitor plate over the second tantalum-comprising layer. In another aspect, the invention includes a component comprising: a) a first tantalum-comprising layer; and b) a second tantalum-comprising layer over the first tantalum-comprising layer, the second tantalum-comprising layer comprising nitrogen.

24 Claims, 2 Drawing Sheets

U.S. PATENT DOCUMENTS

| | | |
|---|---|---|
| 4,891,682 A | 1/1990 | Yusa et al. |
| 4,952,904 A | 8/1990 | Johnson et al. |
| 5,053,917 A | 10/1991 | Miyasaka et al. |
| 5,079,191 A | 1/1992 | Shinriki |
| 5,111,355 A | 5/1992 | Anand |
| 5,142,438 A | 8/1992 | Reinberg |
| 5,191,510 A | 3/1993 | Huffman |
| 5,192,871 A | 3/1993 | Ramakrishnan et al. |
| 5,234,556 A | 8/1993 | Oishi |
| 5,279,985 A | 1/1994 | Kamiyama |
| 5,293,510 A | 3/1994 | Takenaka |
| 5,316,982 A | 5/1994 | Taniguchi |
| 5,330,935 A | 7/1994 | Dobuzinsky et al. |
| 5,335,138 A | 8/1994 | Sandhu et al. |
| 5,348,894 A | 9/1994 | Gnade et al. |
| 5,352,623 A * | 10/1994 | Kamiyama ................. 438/396 |
| 5,362,632 A | 11/1994 | Mathews |
| 5,372,859 A | 12/1994 | Thakoor |
| 5,390,072 A | 2/1995 | Anderson et al. |
| 5,397,446 A | 3/1995 | Ishihara et al. |
| 5,411,912 A | 5/1995 | Sakamoto |
| 5,438,012 A | 8/1995 | Kamiyama |
| 5,442,213 A | 8/1995 | Okudaira |
| 5,442,585 A | 8/1995 | Eguchi et al. |
| 5,452,178 A | 9/1995 | Emesh et al. |
| 5,466,629 A | 11/1995 | Mihara et al. |
| 5,468,687 A | 11/1995 | Carl et al. |
| 5,471,364 A | 11/1995 | Summerfelt et al. |
| 5,504,041 A | 4/1996 | Summerfelt |
| 5,508,221 A | 4/1996 | Kamiyama |
| 5,508,953 A | 4/1996 | Fukuda et al. |
| 5,510,651 A | 4/1996 | Maniar et al. |
| 5,552,337 A | 9/1996 | Kwon et al. |
| 5,555,486 A | 9/1996 | Kingon et al. |
| 5,557,122 A | 9/1996 | Shrivastava et al. |
| 5,561,307 A | 10/1996 | Mihara et al. |
| 5,580,812 A | 12/1996 | Ikemasu et al. |
| 5,585,300 A | 12/1996 | Summerfelt |
| 5,617,290 A | 4/1997 | Kulwicki et al. |
| 5,641,702 A | 6/1997 | Imai et al. |
| 5,654,222 A | 8/1997 | Sandhu et al. |
| 5,661,319 A | 8/1997 | Fujii et al. |
| 5,663,088 A | 9/1997 | Sandhu et al. |
| 5,665,210 A * | 9/1997 | Yamazaki ...................... 438/3 |
| 5,668,040 A | 9/1997 | Byun |
| 5,675,028 A * | 10/1997 | Neumayer et al. |
| 5,688,724 A | 11/1997 | Yoon et al. |
| 5,723,382 A | 3/1998 | Sandhu et al. |
| 5,728,603 A | 3/1998 | Emesh |
| 5,741,626 A | 4/1998 | Jain et al. |
| 5,780,115 A | 7/1998 | Park et al. |
| 5,780,359 A | 7/1998 | Brown et al. |
| 5,783,253 A | 7/1998 | Roh |
| 5,786,248 A | 7/1998 | Schuegraf |
| 5,790,366 A | 8/1998 | Desu et al. |
| 5,798,903 A | 8/1998 | Dhote et al. |
| 5,807,774 A | 9/1998 | Desu et al. |
| 5,814,852 A | 9/1998 | Sandhu et al. |
| 5,834,060 A | 11/1998 | Kawahara et al. |
| 5,834,345 A | 11/1998 | Shimizu |
| 5,837,591 A | 11/1998 | Shimada et al. |
| 5,837,593 A | 11/1998 | Park et al. |
| 5,838,035 A | 11/1998 | Ramesh |
| 5,843,830 A | 12/1998 | Graettinger et al. |
| 5,844,771 A | 12/1998 | Graettinger et al. |
| 5,858,873 A | 1/1999 | Vitkavage et al. |
| 5,872,696 A | 2/1999 | Peters et al. |
| 5,876,788 A | 3/1999 | Bronner et al. |
| 5,888,295 A | 3/1999 | Sandhu et al. |
| 5,899,740 A | 5/1999 | Kwon |
| 5,910,218 A | 6/1999 | Park et al. |
| 5,910,880 A | 6/1999 | DeBoer et al. |
| 5,913,125 A | 6/1999 | Brouillette et al. |
| 5,916,634 A | 6/1999 | Fleming et al. |
| 5,919,531 A | 7/1999 | Arkles et al. |
| 5,930,106 A | 7/1999 | Deboer et al. |
| 5,930,584 A | 7/1999 | Sun et al. |
| 5,933,316 A | 8/1999 | Ramakrishnan et al. |
| 5,943,580 A | 8/1999 | Ramakrishnan |
| 5,955,758 A | 9/1999 | Sandhu et al. |
| 5,970,369 A | 10/1999 | Hara et al. |
| 5,985,714 A | 11/1999 | Sandhu et al. |
| 5,990,507 A | 11/1999 | Mochizuki et al. |
| 6,010,744 A | 1/2000 | Buskirk et al. |
| 6,010,931 A | 1/2000 | Sun et al. |
| 6,015,989 A | 1/2000 | Horikawa et al. |
| 6,017,789 A | 1/2000 | Sandhu et al. |
| 6,027,969 A | 2/2000 | Huang et al. |
| 6,028,359 A | 2/2000 | Merchant et al. |
| 6,028,360 A | 2/2000 | Nakamura et al. |
| 6,037,205 A | 3/2000 | Huh et al. |
| 6,046,469 A | 4/2000 | Yamazaki et al. |
| 6,048,764 A | 4/2000 | Suzuki et al. |
| 6,051,859 A | 4/2000 | Hosotani et al. |
| 6,054,730 A | 4/2000 | Noguchi |
| 6,071,771 A | 6/2000 | Schuegraf ...................... 438/240 |
| 6,081,034 A | 6/2000 | Sandhu et al. |
| 6,090,659 A | 7/2000 | Laibowitz et al. |
| 6,096,597 A | 8/2000 | Tsu et al. |
| 6,143,597 A | 11/2000 | Matsuda et al. |
| 6,146,959 A | 11/2000 | DeBoer ...................... 438/393 |
| 6,150,208 A | 11/2000 | DeBoer et al. |
| 6,150,706 A | 11/2000 | Thakur et al. |
| 6,156,638 A | 12/2000 | Agarwal ...................... 438/627 |
| 6,162,744 A | 12/2000 | Al-Shareef ................. 438/785 |
| 6,165,833 A | 12/2000 | Parekh |
| 6,165,834 A | 12/2000 | Agarwal ...................... 438/240 |
| 6,168,985 B1 | 1/2001 | Asano et al. |
| 6,171,925 B1 | 1/2001 | Graettinger et al. ........ 438/396 |
| 6,180,481 B1 | 1/2001 | DeBoer et al. |
| 6,191,443 B1 | 2/2001 | Al-Shareef et al. |
| 6,197,653 B1 | 3/2001 | Khamankar et al. |
| 6,198,124 B1 | 3/2001 | Sandhu et al. .............. 257/310 |
| 6,201,728 B1 | 3/2001 | Narui et al. |
| 6,235,594 B1 | 5/2001 | Merchant et al. |
| 6,239,459 B1 | 5/2001 | Al-Shareef ................. 257/296 |
| 6,255,186 B1 | 7/2001 | Al-Shareef et al. ......... 438/396 |
| 6,275,370 B2 | 8/2001 | Gnade |
| 6,282,080 B1 | 8/2001 | DeBoer ...................... 361/311 |

FOREIGN PATENT DOCUMENTS

| | | | |
|---|---|---|---|
| JP | 405211288 A | | 8/1993 |
| JP | 5-243524 | * | 9/1993 |
| JP | 405343641 | | 12/1993 |
| JP | 06-021333 | | 1/1994 |
| JP | 6-061449 | * | 3/1994 |
| JP | 04162527 A | | 6/1995 |
| JP | 407161827 A | | 6/1995 |
| WO | WO 97/44797 | | 11/1997 |

OTHER PUBLICATIONS

Ghandhi, VLSI Fabrication Principles: Silicon and Gallium Arsenide, 2nd edition, John Wiley & Sons, Inc., New York, 1994, pp. 522–523.*

Wolf et al., Silicon Processing for the VLSI Era, vol. 1: Process Technology, Lattice Press, Sunset Beach, California, 1986, pp. 335,336,348–353.*

Fazan, P.C., et al., "A High–C Capacitor (20.4fF/$\beta m^2$) with Ultrathin CVD–$Ta_2O_5$ Films Deposited on Rugged Poly–Si for High Density DRAMs", 1992 IEEE, pp. 263–266.

Lesaicherre, P–Y, et al., "A Gbit–Scale DRAM Stacked Capacitor Technology with ECR MOCVD $SrTiO_3$ and RIE Patterned $RuO_2$/TiN Storage Nodes", 1994 IEEE, pp. 831–834.

Yamaguchi, H., et al., "Structural and Electrical Characterization of $SrTiO_3$ Thin Films Prepared by Metal Organic Chemical Vapor Deposition", Jpn. J. Appl. Phys. vol. 32 (1993), Pt. 1, No. 9B, pp. 4069–4073.

Onishi, Shigeo et al, "A Half–Micron Ferroelectric Memory Cell Technology with Stacked Capacitor Structure", IEEE, IEDM 94–843, pp. 843–846 (1994).

Wolf, Stanley, "Silicon Processing for the VLSI Era", pp. 589–591, (1990).

McIntyre, Paul C., et al, Kinetics and Mechanisms of TiN Oxidation Beneath Pt/TiN Films, J. Appl. Phys., vol. 82, No. 9., pp 4577–4585 (11/97).

Anonymous Research Disclosure, 1989RD–0299041 titled "Double High Dielectric Constant Capacitor", Derwent–Week 198917 (Derwent World Patent Index.

H. Shinriki and M. Nakata, IEEE, Transaction On Electron Devices, "$UV-O_3$ and $Dry-O_2$: Two step Annealed Chemical Vapor–Deposited $Ta_2O_5$ Films for Storage Dielectrics of 64–Mb DRAM's", vol. 38 No. 3, Mar. 1991.

Chang, "Structures of Tantalum Pentoxide Thin Films Formed By Reactive Sputtering of Ta Metal", 1995, Thin Solid Films, pp. 56–63.

U.S. patent application Ser. No. 09/059,057, filed Apr. 10, 1998, Agarwal et al.

IBM Technical Disclosure Bulletin: "Process for Selective Etching of Tantalum Oxide", vol. 27, No. 12, May 1985, one page.

U.S. patent application Ser. No. 09/512,149, Agarwal, filed Feb. 23, 2000.

Farooq et al., Tantalum Nitride as a Diffusion Barrier Between $Pd_2Si$ or $CoSi_2$ Aluminum, J. Appl. Phys. vol. 65, Issue 8, Apr. 1989, pp. 3017–3022.

Kamiyama, et al., Ultrathin Tantalum Oxide Capacitor Dielectric Layers Fabricated Using Rapid Thermal Nitridation Prior to Low Pressure Chemical Vapor Deposition, J. Electrochem. Soc., vol. 140, No. 6, pp. 1617–1625.

Kamiyama et al., Highly Reliable 2.5nm $Ta_2O_3$ Capacitor Process Technology for 256Mbit DRAMs, NEC Corporation, VLSI Development Division, 1991 IEEE.

* cited by examiner

METHOD OF FORMING CAPACITORS CONTAINING TANTALUM

RELATED PATENT DATA

This patent resulted from a continuation application of patent application Ser. No. 09/098,035, filed Jun. 15, 2998, now U.S. Pat. No. 6,146,959, which resulted from a divisional application of patent application Ser. No. 08/916,771, filed Aug. 20, 1997, now U.S. Pat. No. 5,910,880.

TECHNICAL FIELD

The invention pertains to semiconductor circuit components and capacitors, and to methods of forming capacitors and semiconductor circuit components.

BACKGROUND OF THE INVENTION

Tantalum pentoxide ($Ta_2O_5$) is a desired capacitor dielectric material due to its high dielectric constant of about 25. In contrast, other commonly utilized dielectric materials have much lower dielectric constants. For instance, silicon nitride has a dielectric constant of about 8 and silicon dioxide has a dielectric constant of about 4. Due to the high dielectric constant of $Ta_2O_5$, a thinner layer of $Ta_2O_5$ can be utilized in capacitor constructions to achieve the same capacitance as thicker layers of other materials.

Semiconductive capacitors comprise a first conductive plate and a second conductive plate, with a dielectric layer formed between the plates. Commonly the conductive plates comprise doped polysilicon, with one or both of the plates comprising a rugged form of polysilicon, such as, for example, hemispherical grain polysilicon.

It is highly desired to utilize $Ta_2O_5$ as the dielectric layer due to the dielectric properties discussed above. Unfortunately, the chemical vapor deposition (CVD) processes by which $Ta_2O_5$ is formed adversely complicate its incorporation into semiconductive capacitors. For instance, $Ta_2O_5$ is not typically deposited onto a first polysilicon plate, nor is a second polysilicon plate typically directly deposited onto $Ta_2O_5$. The CVD processes by which $Ta_2O_5$ is formed adversely affect underlying and overlying polysilicon layers unless such polysilicon layers are first protected with barrier layers. Specifically, $Ta_2O_5$ is typically formed by a CVD process in which $Ta(OC_2H_5)_5$ and oxygen are combined. Unless a polysilicon plate is protected by a barrier layer before such CVD deposition over the polysilicon, the oxygen of the CVD process will react with the polysilicon to disadvantageously form a layer of silicon dioxide over the polysilicon. Present methods for protecting the polysilicon include provision of a silicon nitride layer over the polysilicon prior to formation of $Ta_2O_5$. The silicon nitride layer is typically 10 to 20 angstroms thick. Also, unless a $Ta_2O_5$ layer is first covered with a barrier layer before formation of polysilicon over the $Ta_2O_5$ layer, the polysilicon will react with oxygen in the $Ta_2O_5$ layer to disadvantageously form silicon dioxide.

An example prior art process for forming a capacitor 10 having a $Ta_2O_5$ dielectric layer is illustrated in FIG. 1. A polysilicon first capacitor plate 12 is formed over a substrate 14. A silicon nitride layer 16 is formed over polysilicon layer 12. A $Ta_2O_5$ dielectric layer 18 is formed over silicon nitride layer 16 by the above-described CVD process. After the CVD of $Ta_2O_5$ layer 18, the layer is typically subjected to an anneal in the presence of an oxygen ambient. The anneal drives any carbon present in layer 18 out of the layer and advantageously injects additional oxygen into layer 18 such that the layer uniformly approaches a stoichiometry of five oxygen atoms for every two tantalum atoms. The oxygen anneal is commonly conducted at a temperature of from about 400° C. to about 1000° C. utilizing, an ambient comprising an oxygen containing gas. The oxygen containing gas commonly comprises one or more of $O_3$, $N_2O$ and $O_2$. The oxygen containing gas is typically flowed through a reactor at a rate of from about 0.5 slm to about 10 slm.

$Ta_2O_5$ layer 18 is typically from about 40 angstroms to about 150 angstroms thick and can be either amorphous or crystalline. It is noted that $Ta_2O_5$ is generally amorphous if formed below 600° C. and will be crystalline if formed, or later processed, at or above 600° C. Typically, a $Ta_2O_5$ layer is deposited as an amorphous layer and the above-described oxygen anneal is conducted at a temperature of 600° C. or greater to convert the amorphous $Ta_2O_5$ layer to a crystalline layer.

A second nitride layer 20 is deposited over $Ta_2O_5$ layer 18. Second nitride layer 20 typically comprises TiN or WN. A second capacitor plate 22 is formed over nitride layer 20. Second capacitor plate 22, like first capacitor plate 12, typically comprises doped polysilicon or doped rugged polysilicon. It is noted that the top electrode of the $Ta_2O_5$ capacitor can comprise only TiN or WN layer 20, or can comprise the layer 20 and layer 22 stack.

The formation of layer 20 is typically done by a chemical vapor deposition process, as opposed to a sputtering type process, to achieve acceptable conformity in high aspect ratio capacitor devices. Such CVD processes use either metal organic precursors or organometallic precursors. Either precursor contains carbon and results in the deposition of a barrier layer 20 which typically .includes large amounts of carbon, commonly from about 10 to about 15 volume percent, and sometimes as much as 30 volume percent. Although such carbon typically does not adversely impact the function or conductivity of the nitride layer 20, subsequent wafer processing can cause carbon from layer 20 to diffuse into $Ta_2O_5$ layer 18. Carbon diffusing into $Ta_2O_5$ layer 18 can disadvantageously cause layer 18 to leak current, and in extreme cases can convert an intended capacitor device 10 into a device that behaves more like a resistor than a capacitor.

An additional disadvantage that can occur during placement of a nitride barrier layer 20 over $Ta_2O_5$ layer 18 is that there is typically some formation of the undesired compound $TiO_2$ at an interface between $Ta_2O_5$ layer 18 and barrier layer 20.

It would be desirable to develop alternative methods of utilizing $Ta_2O_5$ in integrated circuit construction.

SUMMARY OF THE INVENTION

In one aspect, the invention encompasses methods of forming a dielectric layer. A first tantalum-comprising layer is formed and a second tantalum-comprising layer is formed over the first tantalum-comprising layer. The second tantalum-comprising layer comprises nitrogen.

In another aspect, the invention encompasses a method of forming a capacitor. A first capacitor plate is formed and a first layer is formed over the first capacitor plate. The first layer comprises tantalum oxide. A second layer is formed over the first layer. The second layer comprises tantalum and nitrogen. A second capacitor plate is formed over the second layer.

In another aspect, the invention encompasses a method of forming a capacitor. A first capacitor plate is formed. A first layer is formed over the first capacitor plate. The first layer comprises tantalum and oxygen, and is substantially void of carbon. A barrier layer is formed over the first layer. A metal nitride layer is formed over the barrier layer. A second capacitor plate is formed over the metal nitride layer. The metal nitride layer is processed at a sufficient temperature to diffuse carbon from the metal nitride layer. The barrier layer substantially prevents the diffused carbon from permeating into the first layer.

In another aspect, the invention encompasses a semiconductor circuit component comprising a first tantalum-comprising layer and a second tantalum-comprising layer over the first tantalum-comprising layer. The second tantalum-comprising layer comprises nitrogen.

In another aspect, the invention encompasses a capacitor. The capacitor comprises a first capacitor plate and a first layer over the first capacitor plate. The first layer comprises tantalum and oxygen. The capacitor further includes a second layer over the first layer. The second layer comprises tantalum and nitrogen. Additionally, the capacitor includes a second capacitor plate over the second layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
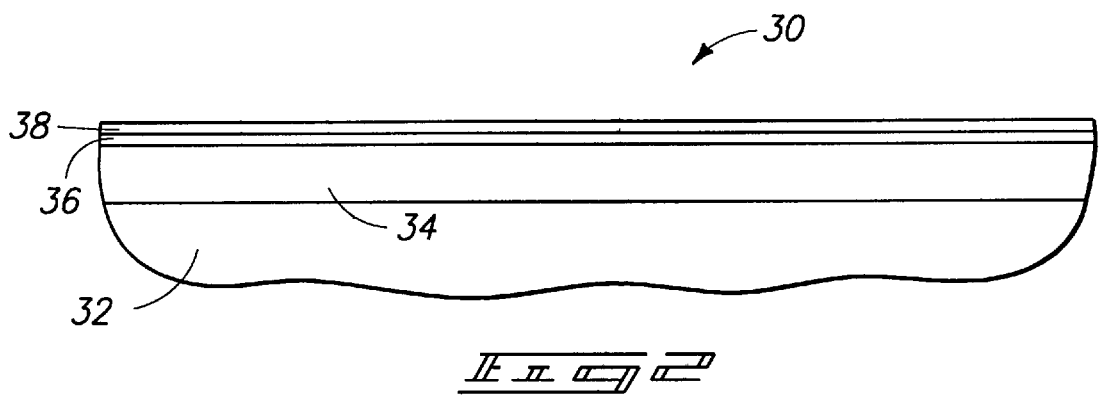
FIG. 2 is a fragmentary diagrammatic cross-sectional view of a semiconductor wafer fragment at a preliminary processing step of the present invention.

Semiconductor processing methods of the present invention are described with reference to FIGS. 2–5. Referring to FIG. 2, a semiconductor wafer fragment 30 is illustrated at a preliminary processing step in accordance with the present invention. Wafer fragment 30 comprises a substrate 32 upon which is formed a first capacitor plate 34. First capacitor plate 34 preferably comprises conductively doped polysilicon, and most preferably comprises conductively doped rugged polysilicon, such as, for example, hemispherical grain polysilicon. First capacitor plate 34 can be formed by conventional methods.

A nitride layer 36 is formed over first capacitor plate 34 and a tantalum-comprising layer 38 is formed over nitride layer 36. Tantalum-comprising layer 38 preferably comprises $Ta_2O_5$, and nitride layer 36 can comprise, for example, silicon nitride. Layers 34, 36 and 38 can be formed by conventional methods, such as, for example, the methods discussed above in the "Background Of The Invention" section of this disclosure. In the context of the present invention, an additional tantalum-comprising layer will be formed over layer 38. Accordingly, layer 38 may be referred to as a first tantalum-comprising layer.

Figure 3:
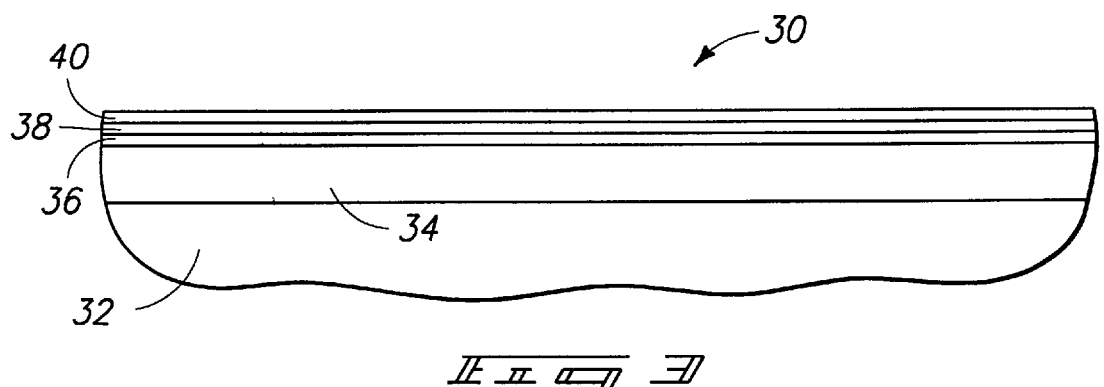
FIG. 3 is a fragmentary cross-sectional view of the FIG. 2 wafer fragment shown at a processing step subsequent to that of FIG. 2.

Referring to FIG. 3, a second tantalum-comprising layer 40 is formed over first tantalum-comprising layer 38. Second tantalum-comprising layer 40 is a barrier layer preferably comprising tantalum and nitrogen, such as in the form $Ta_2N$. Second tantalum-comprising layer 40 can additionally comprise oxygen, and may, for example, comprise a compound having the general formula $Ta_xO_yN_z$.

Second tantalum-comprising layer 40 can be formed by depositing a layer of $Ta_2N$, or $Ta_xO_yN_z$, over first tantalum-comprising layer 38. alternatively, and more preferred, second tantalum-comprising layer 40 is formed by exposing an outer surface of first tantalum-comprising layer 38 to a nitrogen-comprising ambient. Such nitrogen-comprising ambient can, for example, comprise one or more gases selected from a group consisting of hydrazine, hydrazoic acid, ammonia and $NF_3$. Alternatively, the nitrogen-comprising ambient can consist essentially of hydrazine, can consist of essentially of hydrazoic acid, can consist essentially of ammonia, or can consist essentially of $NF_3$. The nitrogen-comprising gas preferably does not consist essentially of $N_2$. The exposure to the nitrogen-comprising ambient can utilize a plasma (rf, ECR or remote plasma) to generate an active nitrogen species. The plasma can contain the nitrogen-comprising ambient, and a diluent such as, $N_2$, $H_2$, Ar, and/or He.

The above-described exposure of an outer surface of layer 38 to a nitrogen-comprising ambient preferably comprises an anneal of layer 38 at a temperature of from abotit 350° C. to about 900° C. The anneal typically comprises heating at least the exposed outer surface of layer 38 to such temperature. If the nitrogen-comprising ambient consists essentially of hydrazine, the annealing temperature is preferably from about 350° C. to about 600° C. If the nitrogen-comprising ambient consists essentially of ammonia, the annealing temperature is preferably from about 600° C. to about 900° C. It is noted that, as discussed above, $Ta_2O_5$ transforms from an amorphous material to a crystalline material at about 600° C. Accordingly, it may be desired to utilize a hydrazine-comprising gas for forming second tantalum-comprising layer 40 when it is desired to keep $Ta_2O_5$ layer 38 in an amorphous form. In contrast, it may be desired to utilize an ammonia-comprising gas when it is desired to convert an amorphous $Ta_2O_5$ layer 38 to a crystalline form. Methods for exposing a wafer surface to hydrazine, ammonia, $NF_3$ and/or hydrazoic acid in a semiconductor processing reactor at the above-discussed temperatures are known to (persons of ordinary skill in the art First tantalum-comprising layer 38 is preferably exposed to the nitrogen-comprising ambient for a time of from about 30 seconds to about 10 minutes. It is noted that the formation of second tantalum-comprising layer 40 from the interaction of the nitrogen-comprising ambient with first layer 38 will be a self-limiting process which will generally terminate by about 10 minutes. Second tantalum-comprising layer 40 will generally be less than or equal to about 20 angstroms thick at the termination of such process.

Figure 4:
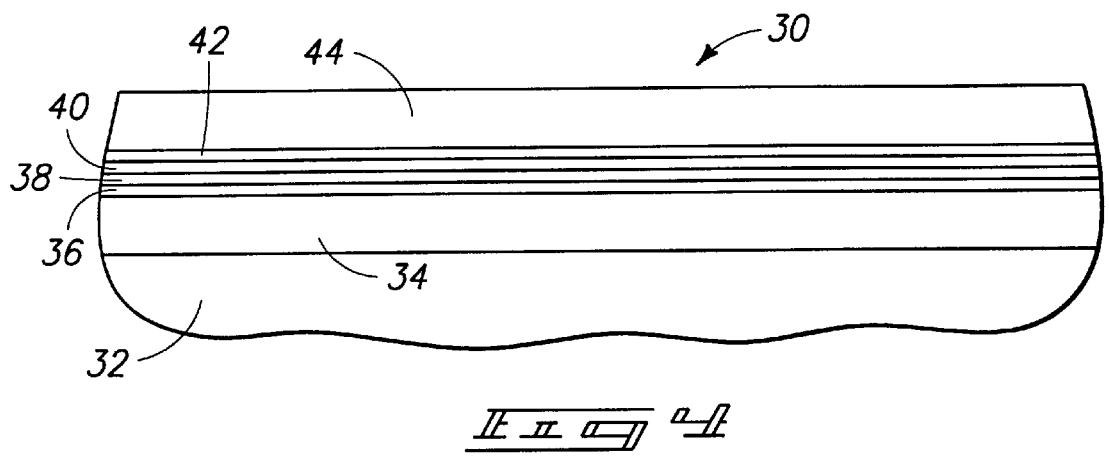
FIG. 4 is a fragmentary cross-sectional view of the FIG. 2 wafer fragment shown at a processing step subsequent to that of FIG. 3, in accordance with a first embodiment of the present invention.
Figure 5:
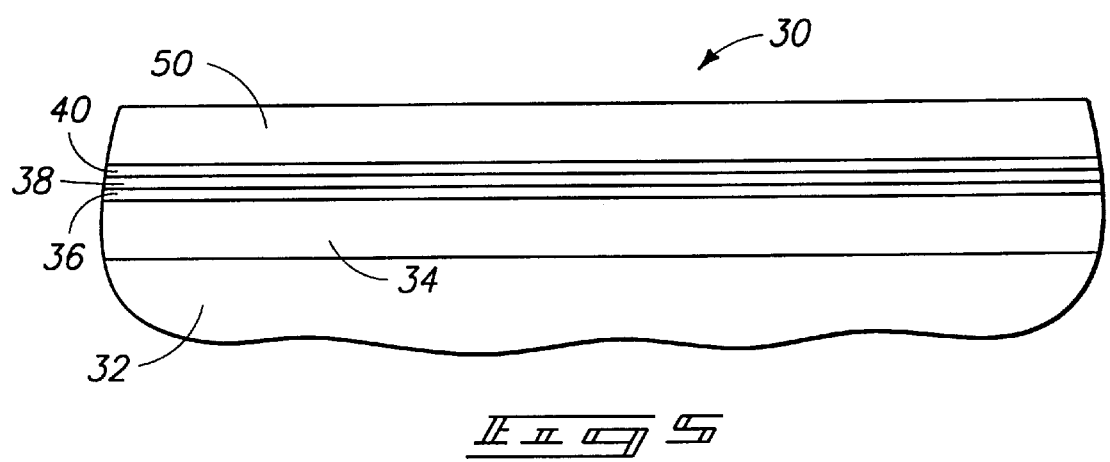
FIG. 5 is a fragmentary cross-sectional view of the FIG. 2 wafer fragment shown at a processing step subsequent to that of FIG. 3, in accordance with a second embodiment of the present invention.

FIGS. 4 and 5 illustrate alternative processing methods which can be utilized after formation of second tantalum-comprising layer 40. Referring to the first embodiment processing method of FIG. 4, a metal nitride layer 42 is formed over second tantalum-comprising layer 40. Metal nitride layer 42 can comprise materials known to persons of ordinary skill in the art, such as, for example, TiN or WN, and can be formed by conventional methods, such as, for example, CVD. Advantageously, if metal nitride layer 42 is formed by a CVD process, carbon present in such layer due to the CVD process will be prevented from diffusing into a $Ta_2O_5$ layer 38 by the barrier layer 40. Accordingly in contrast to prior art processes, $Ta_2O_5$ layer 38 will remain substantially void of carbon in spite of the provision of metal nitride layer 42 overlying $Ta_2O_5$ layer 38. A second capacitor plate 44 is formed over metal nitride layer 42. Second capacitor plate 44 can comprise, for example, conductively doped polysilicon. Second capacitor plate 44 can be formed by conventional processes.

Figure 1:
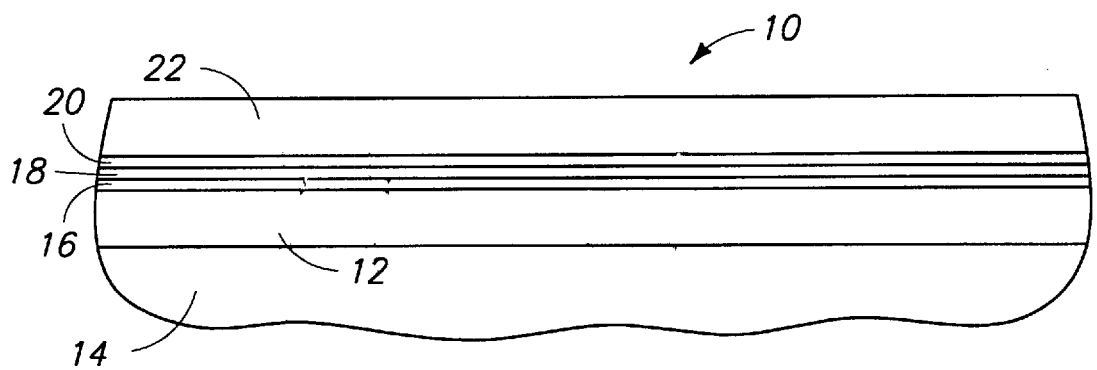
FIG. 1 is a fragmentary diagrammatic cross-sectional view of a semiconductor wafer fragment illustrating a prior art capacitor construction.

Referring to FIG. 5, a second embodiment process for completing a capacitor structure of the present invention is illustrated. In this embodiment, a second capacitor plate 50 is formed directly over second tantalum-comprising layer 40. Second capacitor plate 50 can comprise, for example, conductively doped polysilicon. Second tantalum-comprising layer 40 functions as a barrier layer between the polysilicon of layer 50 and the $Ta_2O_5$ of layer 38 to prevent an undesired formation of silicon dioxide between layers 50 and 38. Accordingly, barrier layer 40 permits polysilicon layer 50 to be directly deposited over a tantalum-comprising layer, in contrast to prior art processes wherein the polysilicon layer was formed over a non-tantalum-comprising metal nitride layer. It is noted that tantalum-comprising barrier layer 40 not only prevents diffusion of carbon from a metal nitride layer 42 into the $Ta_2O_5$ of layer 38, but also substantially prevents diffusion of oxygen from layer 38 into layers above tantalum-comprising layer 40. It is also noted that barrier layer 40 differs form the prior art barrier layer 20 (described above with reference to FIG. 1) in that barrier layer 40 is substantially void of carbon, i.e., comprises less than 10 volume percent of carbon and preferably less than about 5 volume percent.

The processing described above with reference to FIGS. 2–5 forms semiconductor circuit components comprising first tantalum-comprising layer 38 and an overlying second tantalum-comprising layer 40. Although the above described processing is directed toward capacitor constructions, it is to be understood that such semiconductor circuit components can have application to other electrical structures, besides capacitors, in which a high-dielectric material is desired.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor comprising:
   forming a first electrically conductive layer;
   forming an electrically insulative layer over the first conductive layer, the insulative layer comprising tantalum; and
   forming a second electrically conductive layer spaced from the first conductive layer by some of the insulative layer by exposing an outer surface of the insulative layer to a nitrogen-comprising gas consisting essentially of hydrazoic acid, $NF_3$, or a mixture of hydrazoic acid and $NF_3$, the second conductive layer comprising some of the tantalum of the insulative layer and nitrogen.

2. The method of claim 1 further comprising forming a third electrically conductive layer over the second conductive layer.

3. The method of claim 1 wherein the exposing the outer surface of the insulative layer occurs at a temperature of from about 600 C. to about 900 C.

4. A method of forming a capacitor comprising:
   forming a dielectric layer over a substrate, the dielectric layer comprising tantalum and having an exposed outer surface; and
   forming a conductive layer over the dielectric layer by exposing the outer surface of the dielectric layer to a nitrogen-comprising gas consisting essentially of hydrazoic acid, the conductive layer comprising tantalum and nitrogen.

5. The method of claim 4 wherein the nitrogen-comprising gas consists of hydrazoic acid.

6. The method of claim 4 wherein the exposing the outer surface of the dielectric layer occurs at a temperature of from about 600 C. to about 900 C.

7. The method of claim 4 further comprising forming a first capacitor node over a barrier layer, wherein the substrate comprises a second capacitor node and the conductive layer comprises the barrier layer.

8. The method of claim 4 wherein the forming of the conductive layer comprises chemical vapor depositing a material comprising tantalum and nitrogen onto the outer surface.

9. A method of forming a capacitor comprising:
   forming an electrically insulative layer over a substrate, the insulative layer comprising tantalum; and
   forming a first electrically conductive layer by exposing an outer surface of the insulative layer to a nitrogen-comprising gas comprising predominately hydrazoic acid, $NF_3$, or a mixture of hydrazoic acid and $NF_3$, the conductive layer comprising tantalum from at least some of the tantalum of the insulative layer and nitrogen and being formed without depositing tantalum nitride.

10. The method of claim 9 wherein the exposing the outer surface of the insulative layer occurs at a temperature of from about 600 C. to about 900 C.

11. The method of claim 9 wherein the insulative layer comprises $Ta_2O_5$.

12. The method of claim 9 wherein the conductive layer comprises a barrier layer.

13. The method of claim 9 wherein the first conductive layer comprises a first capacitor node also exhibiting properties of a barrier layer and the substrate comprises a second capacitor node.

14. The method of claim 9 further comprising forming a second electrically conductive layer over the first conductive layer.

15. The method of claim 14 wherein the first conductive layer comprises a barrier layer, the substrate comprises a first capacitor node, and the second conductive layer comprises a second capacitor node.

16. A method of forming a capacitor comprising:

forming a first electrically conductive layer;

forming an electrically insulative layer over the first conductive layer, the insulative layer comprising tantalum and having an exposed outer surface; and forming a second conductive layer over the insulative layer spaced from the first conductive layer by at least some of the insulative layer by exposing the outer surface of the insulative layer to a nitrogen-comprising gas comprising hydrazoic acid, the second conductive layer comprising tantalum from some of the tantalum of the insulative layer and nitrogen from some of the nitrogen of the nitrogen-comprising gas and being formed without depositing tantalum nitride.

17. The method of claim 16 further comprising forming a third electrically conductive layer over the second conductive layer.

18. The method of claim 16 wherein the exposing to the nitrogen-comprising gas further comprises using a plasma to generate an active nitrogen species.

19. The method of claim 16 wherein the exposing to the nitrogen-comprising gas further comprises annealing at a temperature of from about 600 C. to about 900 C.

20. The method of claim 16 wherein the second conductive layer comprises tantalum nitride.

21. The method of claim 16 wherein the second conductive layer comprises tantalum, oxygen, and nitrogen.

22. The method of claim 16 wherein the insulative layer comprises oxygen.

23. The method of claim 16 wherein the insulative layer consists essentially of $Ta_2O_5$.

24. The method of claim 16 wherein the forming the second conductive layer over the insulative layer is self-limiting.

* * * * *

UNITED STATES PATENT AND TRADEMARK OFFICE
CERTIFICATE OF CORRECTION

PATENT NO. : 6,627,508 B1
DATED : September 30, 2003
INVENTOR(S) : DeBoer et al.

It is certified that error appears in the above-identified patent and that said Letters Patent is hereby corrected as shown below:

Title page,
Item [56], References Cited, U.S. PATENT DOCUMENTS, insert
-- 5,760,474 A   06/1998  Schuele
   5,864,496 A   01/1999  Mueller et al. --
OTHER PUBLICATIONS, insert
-- Eimori, T., et al., "A Newly Designed Planar Stacked Capacitor Cell With high Dielectric Constant Film For 256 Mbit DRAM", 1993 IEEE pp. 631-634.
Van Zant, Microchip Fabrication: A Practical Guide to Semiconductor Processing, Fourth Edition, Library of Congress Cataloging-in-Publication Data, McGraw-Hill, 2000, pps. 388-389. --

Column 1,
Line 7, replace "patent application Ser. No. 09/098,035, filed Jun. 15, 2998" with
-- patent application Ser. No. 09/098,035, filed Jun. 15, 1998 --

Column 3,
Line 67, replace "example, slicon nitride. Layers 34, 36 and 38 can be formed" with
-- example, silicon nitride. Layers 34, 36 and 38 can be formed --

Column 4,
Line 35, replace "an anneal of layer 38 at a temperature of from abotit 350ºC." with
-- an anneal of layer 38 at a temperature of from about 350ºC. --
Line 54, replace "known to (persons of ordinary skill in the art" with
-- known to persons of ordinary skill in the art. --

Signed and Sealed this

Twenty-eighth Day of December, 2004

JON W. DUDAS
*Director of the United States Patent and Trademark Office*